US006598789B1

(12) United States Patent
Matsumoto et al.

(10) Patent No.: US 6,598,789 B1
(45) Date of Patent: Jul. 29, 2003

(54) SUBSTRATE MANAGING SYSTEM AND SUBSTRATE STORING SYSTEM

(75) Inventors: Ken Matsumoto, Utsunomiya (JP); Takashi Nakahara, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/134,087

(22) Filed: Aug. 14, 1998

(30) Foreign Application Priority Data

Aug. 19, 1997 (JP) ............................................. 9-236440

(51) Int. Cl.[7] .............................................. G06K 15/00
(52) U.S. Cl. ...................... 235/383; 235/385; 235/375
(58) Field of Search ...................... 235/462.01, 462.03, 235/462.05, 462.08, 462.13, 462.14, 462.18, 385, 375, 492, 454, 471, 383

(56) References Cited

U.S. PATENT DOCUMENTS 4,636,634 A * 1/1987 Harper et al. ............... 250/223
4,794,238 A * 12/1988 Hampton ................ 235/462.01
5,216,618 A * 6/1993 Arita et al. .................. 364/478
5,303,214 A * 4/1994 Kulakowski et al. ......... 369/34

FOREIGN PATENT DOCUMENTS

JP        2-218108      *  2/1989

* cited by examiner

Primary Examiner—Karl D. Frech
(74) Attorney, Agent, or Firm—Fitzpatrick, Cella, Harper & Scinto

(57) ABSTRACT

A substrate managing system includes a reading device for reading information recorded on a substrate, and an information processing device for performing management of the substrate on the basis of the information, wherein the reading device reads information as recorded on an end face of the substrate. At least a portion of a substrate container is made of a transparent material for optical reading of information as recorded on a substrate kept stored in the container.

13 Claims, 7 Drawing Sheets

SUBSTRATE MANAGING SYSTEM AND SUBSTRATE STORING SYSTEM

FIELD OF THE INVENTION AND RELATED ART

This invention relates to a substrate managing or controlling system for handling a substrate (plate-like article) such as a photomask, a reticle, a wafer or a glass plate, for example. Further, the invention is concerned with a substrate container or a substrate storing system for storing such substrate or substrates therein, or a device manufacturing method or an exposure apparatus using such managing system, storing system or container. More specifically, the invention is directed to reading information, such as identification information, for example, as recorded on a substrate by printing, for example, and to controlling conveyance or handling of the substrate in accordance with the information.

Generally, semiconductor device manufacturing apparatuses use a substrate conveying system for automatically conveying a reticle, or a cassette or carrier (hereinafter "cassette") within the apparatus or between different device manufacturing apparatuses, for prevention of adhesion of foreign particles to a substrate such as a reticle or a wafer (hereinafter, "substrate"), for example, or for improved productivity.

In such substrate conveying system, for correct selection of a desired reticle necessary for a particular production process and for quick supply of the same, and for reticle management and handling with higher reliability, a code with a pattern which bears information related to that reticle is printed on a peripheral portion of the substrate, the code being read out in each process or in each apparatus for data collection, registration, identification or confirmation.

On the other hand, due to recent tendency of multiplication of types of LSIs or complication of processes resulting from improvement in performance and reduction in size that causes increases in number of reticles required, the data volume of the code to be printed is increasing.

Also, due to recent tendency of multiplication of types of LSIs or complication of processes resulting from improvement in performance and reduction in size that causes increases in number of reticles required, higher reliability is required for reticle management and handling. A code may be printed on a reticle itself, and the code may be read out inside the apparatus and just before the reticle is used, for final identification and confirmation.

If information is to be recorded on a substrate, in order to attain enlargement of information volume of the reticle data, a large area is required for a code pattern to bear the information. However, on the reticle surface, there are a circuit pattern to be used for manufacture of semiconductor devices, as well as marks such as alignment marks to be used for different exposure processes in different exposure apparatuses. Thus, if the area of code pattern is enlarged, it will cause a difficulty in code layout design to prevent interference with marks on the reticle surface. Also, to prevent interference with marks, as an example, a code has to be divided into plural regions. This creates complexity in reading the code.

In a reticle storing system or a substrate storing shelf inside or outside an exposure apparatus, usually plural substrates are stored in accumulation along a vertical direction. Thus, the code reading when a particular substrate is to be used has to be done after the substrate is once taken out of the storing shelf.

Reticle cassettes or reticle carriers have no optical transparency, and an information code on a reticle can not be read directly. For this reason, a substitute code is printed on a cassette and, by using this substitute code, data collection or registration for the reticle stored inside the cassette is carried out. This necessitates strict control or handling to hold the one-on-one relation between a cassette and a reticle. In that occasion, when the reticle and the cassette are placed separate for cleaning of the reticle or cassette, there is a possibility of occurrence of incorrect mating of cassette reticle, which degrades reliability of reticle management and handling.

A code printed on a reticle itself is used for final identification and confirmation. If incorrect combination of a reticle and a cassette occurs, since the reticle registration is made on the basis of a code as printed on the cassette, the error can not be detected until the reticle is loaded into the apparatus and the code printed on the reticle is read just before it is used. Then, the reticle is unloaded to be replaced. This damages efficient substrate conveyance.

SUMMARY OF THE INVENTION

It is accordingly an object of the present invention to provide higher reliability and efficiency in processing a substrate.

In accordance with an aspect of the present invention, there is provided a substrate managing or controlling system, comprising: reading means for reading information recorded on a substrate; and information processing means for performing management of the substrate on the basis of the information; wherein said reading means reads information as recorded on an end face of the substrate.

With this arrangement, it is unnecessary to take into account the disposition of alignment marks upon a substrate surface, for example, and the whole region of the end face of the substrate can be used for the recording of substrate information. As a result, an enlargement of recording region due to an enlargement in number or type of substrates can be easily met. Further, even in an occasion where substrates are stored while being accumulated in vertical direction, information reading can be done while the substrates are kept stored. This enables flexible and multifarious control of substrates.

In accordance with another aspect of the present invention, there is provided a substrate container wherein at least a portion of said container is made of a transparent material for optical reading of information as recorded on a substrate kept stored in the container. In a substrate managing method according to the present invention, the information of a substrate stored in such substrate container can be read through the transparent material member.

With this structure, the information about the substrate can be read while the substrate is kept stored in the container. Thus, there is no necessity of recording information on the substrate container. Also, it is unnecessary to control the information as recorded on the substrate container and the information about the substrate in one-on-one relation. Further, without reading the information as recorded on the substrate container (as has been done conventionally) and collecting information about the substrate as stored in the container, the information about the substrate can be read directly. As a result, any error of substrate selection, for example, can be detected at an earlier stage and thus efficient and reliable substrate control, substrate conveyance and device manufacture are assured.

In a preferred form, the substrate may be a photomask, a reticle or a wafer to be used in an exposure apparatus. The information recorded on a substrate may be one which can be read optically, such as a bar code, for example.

The information processing means may set parameters, necessary for performing a process related to the substrate, in accordance with the information.

The reading means may read the information of the substrate in a portion of a conveyance path including a conveyance start position and a conveyance completion position.

There may be plural substrates stored in an array in a direction perpendicular to the surface of each substrate, and said reading means may read the information of a desired substrate as kept stored, during relative movement between a reading position of the reading means and the plural substrates stored.

The reading means may include rotating means for rotating the substrate in a horizontal plane, and wherein said reading means reads the recorded information as desired end faces of the rotated substrate are positioned at a reading position of the reading means.

When at least a portion of the substrate container is made of a transparent material, the information about the substrate may be recorded on an end face of the substrate.

When at least a portion of the substrate container is made of a transparent material, the information about the substrate as stored in the container may be read through the transparent material. In such case, the information reading may be done by use of a light projecting device disposed at a side of said container and a light detecting device for detecting light projected and passed a portion of the substrate where the information is recorded. The information reading may be done in a portion of a conveyance path including a conveyance start position and a conveyance completion position.

A substrate managing system or a substrate storing system such as:described above may be incorporated into an exposure apparatus.

Where a substrate comprises an original having a pattern to be exposed, there may be provided a device manufacturing method wherein information recorded on an end face of the original is read, or information of the original is read through a transparent portion of a container in which the original is stored, and the pattern of the original is printed onto a workpiece to be exposed, on the basis of the information.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

[Embodiment 1]

Figure 1:
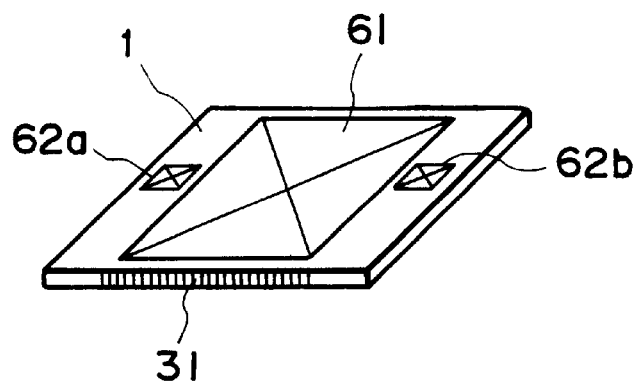
FIG. 1 is a perspective view of a reticle having a bar code provided on an end face thereof, used in a first embodiment of the present invention.

FIG. 1 is a schematic view of a reticle which best shows features of the present invention. Denoted at 1 is a reticle, and denoted at 31 is a bar code which is provided on an end face of the reticle. Denoted at 61 is a pattern to be printed, by exposure, on a wafer in semiconductor manufacturing procedure. The pattern occupies most of the area on the reticle surface. Denoted at 62a and 62b are alignment marks which are formed in marginal portions at left and right sides of the reticle pattern 61.

Since the bar code 31 is formed on the end face of the reticle, for a six-inch reticle, for example, an area of 6.35 mm×152 mm can be used freely for the code layout. Thus, a sufficient area can be assured for the code printing for substrate control wherein one of a large number of substrates should be discriminated. For a nine-inch reticle which is currently being standardized, a larger area can be used.

A reticle managing or controlling system using a bar code for reticle control, will be explained below.

Figure 2:
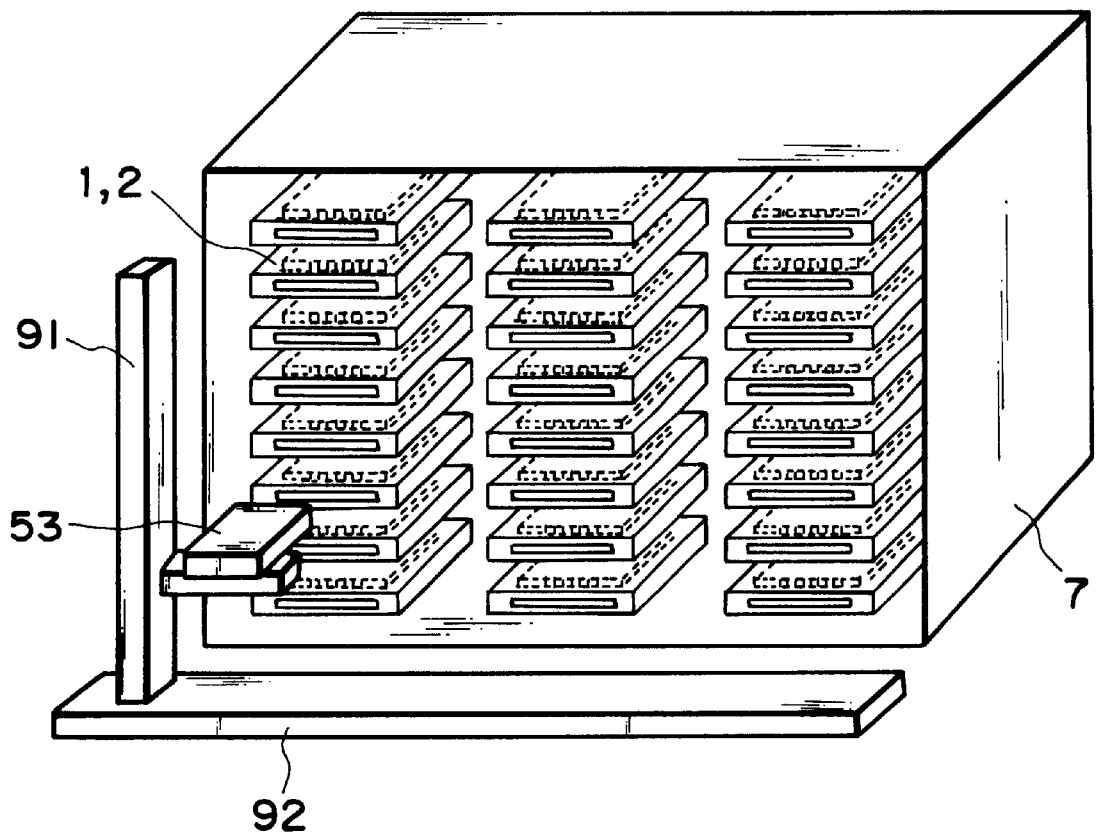
FIG. 2 is a perspective view of a reticle storing system with a bar code reading device, in a second embodiment of the present invention.

FIG. 2 shows a reticle managing system, in which denoted at 1 is a reticle, and denoted at 2 is a reticle cassette. Denoted at 53 is a bar code reading device, and denoted at 7 is a reticle storing device. Denoted at 91 is a Z slider for moving the bar code reading device upwardly and downwardly. Denoted at 92 is an X slider for moving the Z slider laterally.

Figure 3:
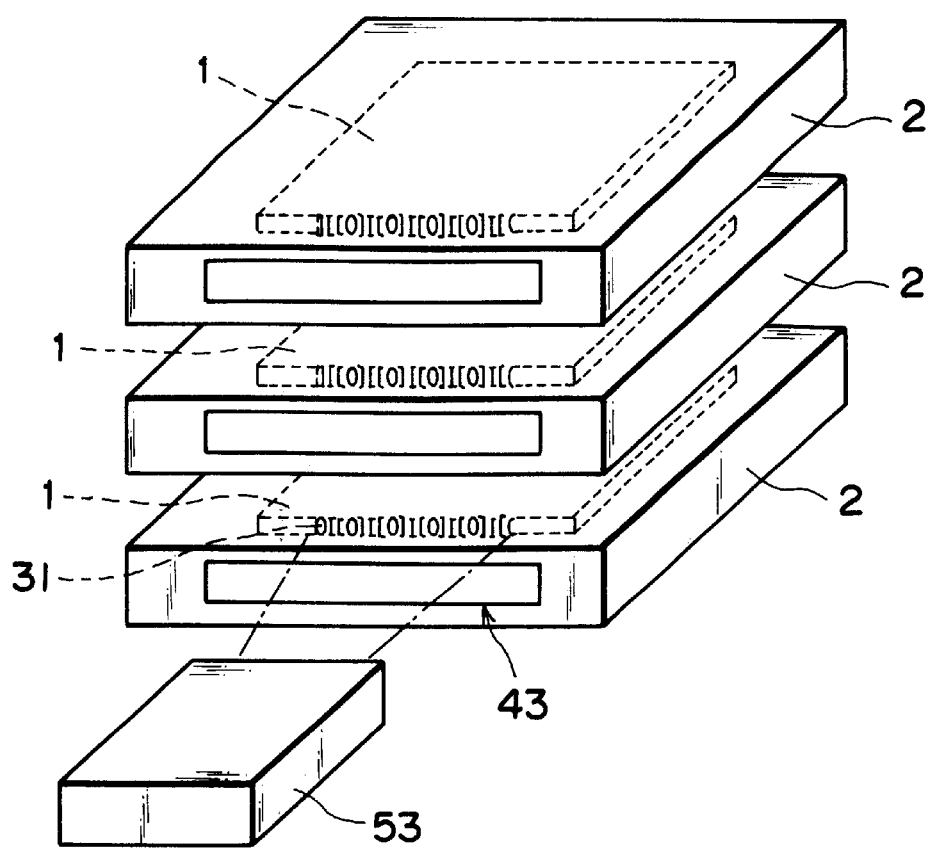
FIG. 3 is an enlarged and perspective view of a portion of the FIG. 2 structure, for explaining bar code reading.

By moving the bar code reading device 53 vertically and laterally by means of the Z slider 91 and the X slider 92, a bar code of any substrate stored in the reticle storing device 7 can be read. FIG. 3 is an enlarged view for explaining bar code reading. Denoted at 31 is a bar code which is provided on an end face of a reticle. Denoted at 43 is a window which is formed on a side face of a reticle cassette and which is optically transparent. Since the bar code 31 is formed on an end face of each reticle, the bar code reading can be done while the reticles are kept stacked vertically as shown in FIG. 2 or 3.

[Embodiment 2]

Figure 4:
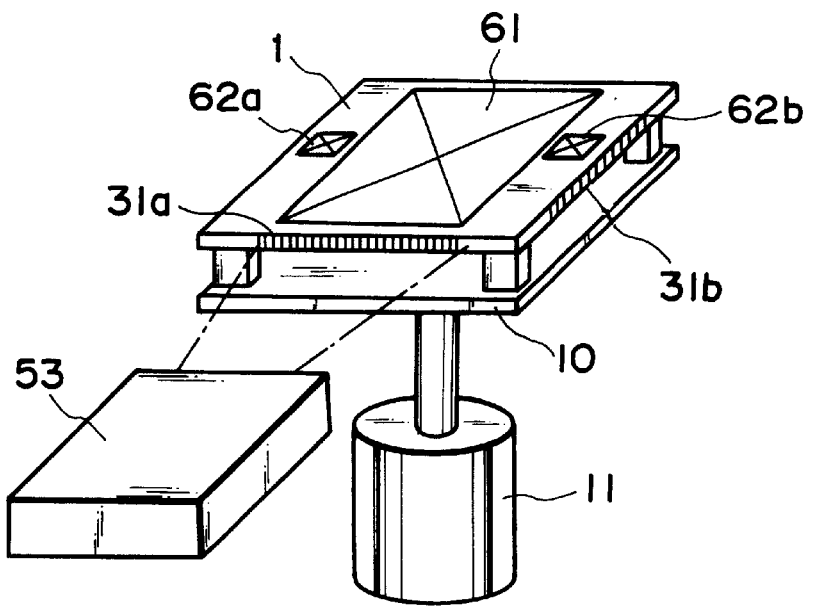
FIG. 4 is a perspective view of a bar code reading device, in a third embodiment of the present invention.

FIG. 4 shows a bar code reading device for reading bar codes formed on plural end faces, in a second embodiment of the present invention. Denoted at 1 is a reticle, and denoted at 31a and 31b are bar codes formed on end faces of the reticle. Denoted at 53 is a bar code reading device, and denoted at 10 is a reticle holding table. Denoted at 11 is rotational driving means.

With the arrangement described above, the reticle 1 is held in horizontal position by the reticle holding table 10. The bar code reading device 53 is disposed at a position whereat the bar code 31a formed on an end face of the reticle can be read, and it reads the bar code. Subsequently, the rotational driving means 11 rotates the reticle holding table 10 by 90 deg., to rotate the bar code 31b position to the position whereat it can be read by the reading device 53. Then, the reading device reads the bar code. By providing codes on plural faces of a reticle, the reading device can meet a multifarious substrate control system.

[Embodiment 3]

Figure 5:
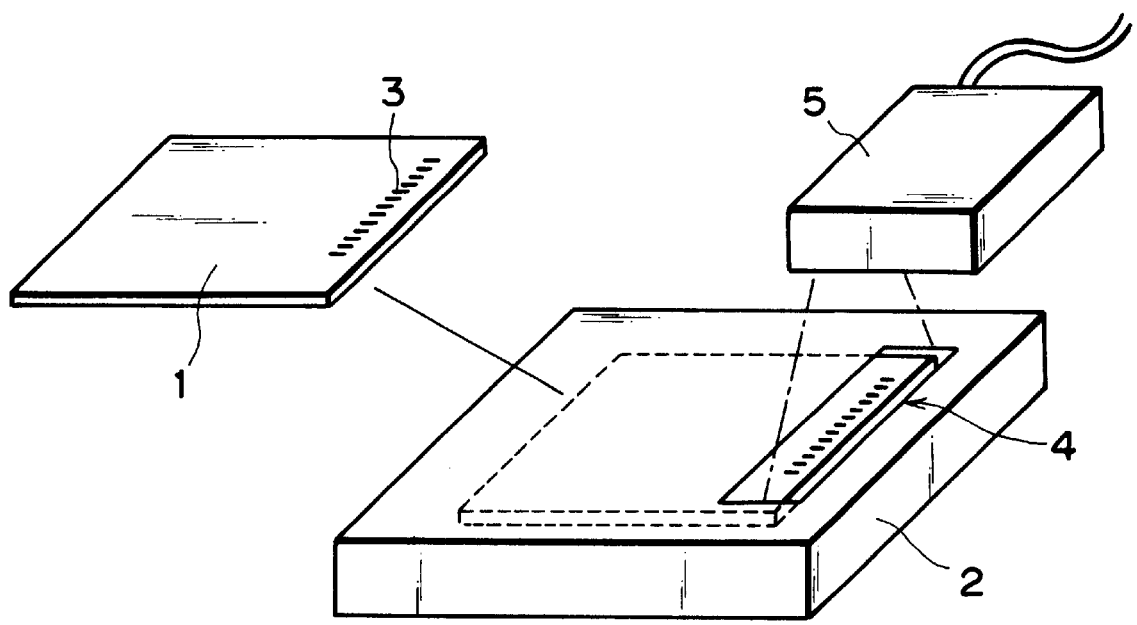
FIG. 5 is a perspective view of a reticle storing container and a reticle bar code reading device, in a fourth embodiment of the present invention.

FIG. 5 shows a third embodiment of the present invention, wherein denoted at 1 is a reticle, and denoted at 2 is a reticle cassette for storing the reticle 1 therein. Denoted at 3 is a bar code which bears information related to the reticle. This bar code is provided in a circumferential portion of the reticle. Denoted at 4 is a transparent window which is provided on the cassette and which is made of an optically transparent material. Denoted at 5 is a bar code reader which includes a light projecting portion and a detecting portion disposed therewithin.

More specifically, the reticle 1 has a bottom surface on which a device pattern to be printed on a wafer for semiconductor manufacture is formed by use of Cr, for example. Outside the exposure range, a bar code 3 which bears information about the device pattern is formed similarly by use of Cr, for example. The reticle cassette 2 is provided with an optically transparent window 4 which is formed at such position that the bar code 3 can be read from the outside while the reticle 1 having the device pattern and the bar code 3 is kept stored in the reticle cassette. As for the material of the window 4, a PMMA material may be used, for example. If the weight, for example, is not limited, a glass material may be used. Also, the whole cover member of the cassette, not a portion thereof, may be made of such material.

Disposed above the cassette 2 is the bar code reader 5 which is placed at a position whereat the bar code of the reticle can be read through the transparent window 4. The bar code reader 5 has a light projecting portion for projecting light, and a detecting portion for detecting reflection light reflected from the Cr portion of the bar code 4, by which the bar code pattern can be read. The light projected to the bar code region of the reticle goes through the transparent window 4 and then it is reflected by the Cr portion of the bar code. Then, the light goes again through the transparent window 4, and it is received by the detecting portion of the bar code reader 5. It is to be noted that the total reflection factor for the reflection light (transmission factor of the transparent window plus reflection factor of Cr plus transmission factor of the transparent window) should be not less than 75%. Also, while the light projected to the glass portion of the bar code transmits therethrough, it does not transmit by 100% but a small portion is reflected at the interface between the glass and the air. The print contrast signal (PCS), which is a value representing the difference in reflection factor between the glass portion (transmissive portion) and the Cr portion (reflective portion), that is, PCS={(reflection factor of Cr portion minus reflection factor of glass portion)/(reflection factor of Cr portion)}, should desirably be not less than 0.6.

The Cr portion and glass portion can be provided in accordance with software processing, to meet any of bars and spaces of the bar code pattern.

[Embodiment 4]

Figure 6:
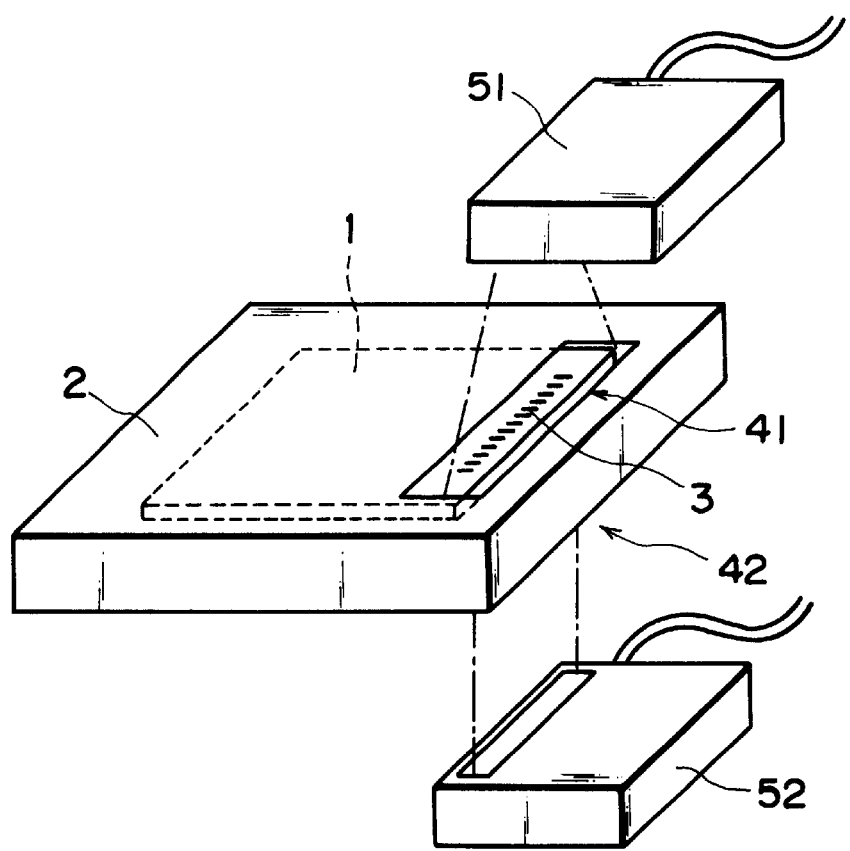
FIG. 6 is a perspective view of a reticle storing container and a reticle bar code reading device, in a fifth embodiment of the present invention.

FIG. 6 shows a transmission type bar code reading device in a fourth embodiment of the present invention. A cassette 2 is provided with upper and lower transparent windows 41 and 42 which are disposed at positions where a bar code 3 formed on a reticle 2, placed inside the cassette 2, can be read. Disposed above the upper transparent window 41 is a light projecting portion 51 of the bar code reader, and disposed below the lower transparent window 42 is a detecting portion 52 of the bar code reader. They are mounted so that the light projecting portion 51 projects light which goes through the bar code 3 and is received by the detecting portion 52. In this structure, the light projecting portion and the detecting portion may be disposed inversely. Since in this embodiment the bar code pattern is formed on the bottom face of the reticle 1, the bar code reader detecting portion 52 may preferably be disposed below the reticle.

In such transmission type code reading system, the light is blocked approximately by 100% by the Cr portion of the bar code, as discussed in Japanese Laid-Open Patent Application, Laid-Open No. 66118/1995. Thus, the ratio of PCS to transmission light at the glass portion becomes approximately 1. Consequently, there is no reading error and the reading reliability is very high.

Also in this case, the total reflection factor for the transmission light (transmission factor of upper transparent window plus transmission factor of reticle glass portion plus transmission factor of lower transparent window) should be not less than 75%.

The reading method in such system is not limited to use of a bar code. It can be applied to information reading based on various patterns having reticle information, such as two-dimensional code, for example.

[Embodiment 5]

Figure 7:
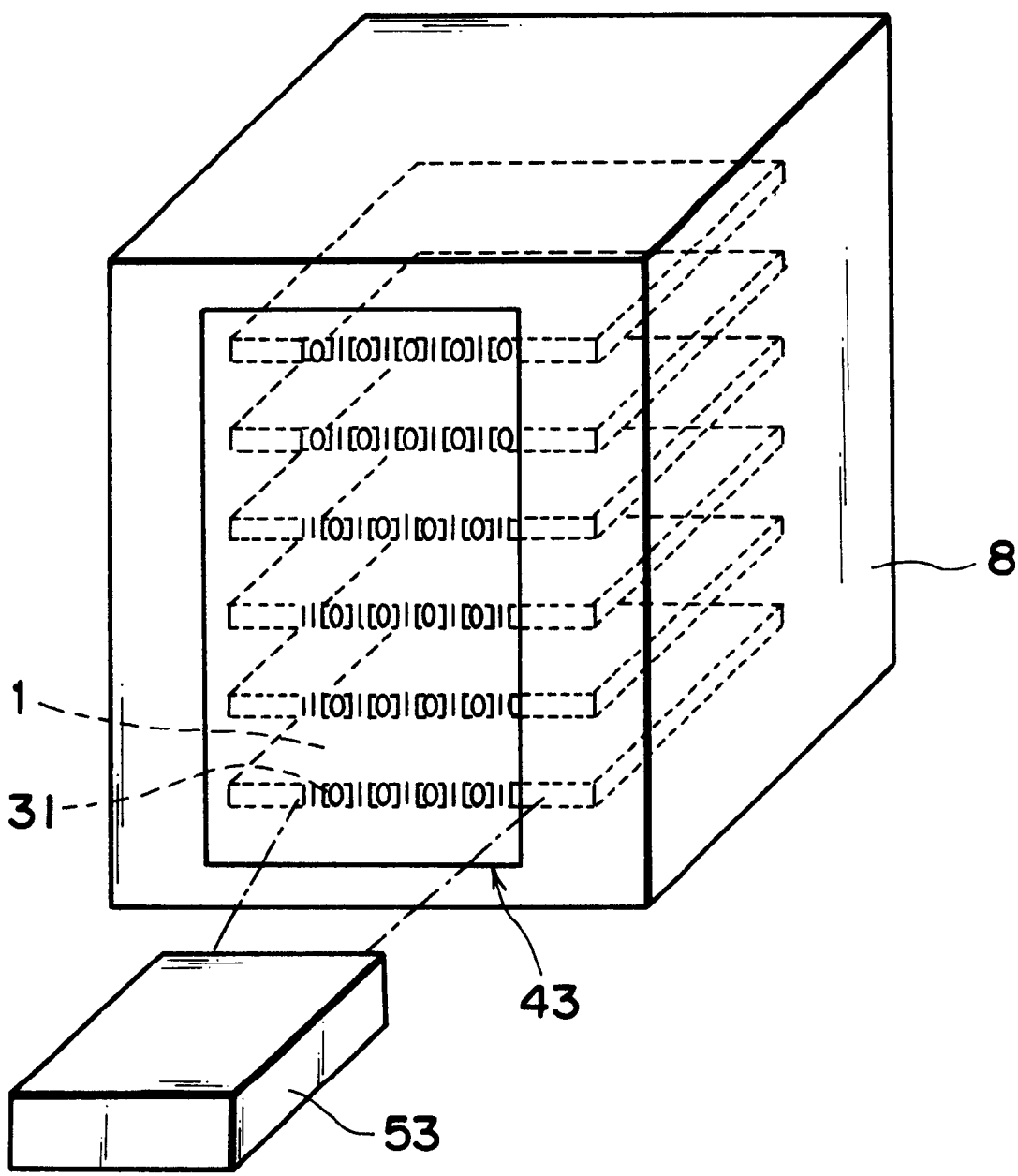
FIG. 7 is a perspective view of a container for storing plural reticles therein and a reading device for reading bar codes on end faces of the reticles, in a fourth embodiment of the present invention.

FIG. 7 shows a fifth embodiment of the present invention, wherein denoted at 1 are reticles and denoted at 31 are bar codes formed on end faces of the reticles. Denoted at 43 is a side face transmission window disposed at a position for reading the bar code 31 from the outside. Denoted at 53 is a bar code reading device disposed at a position where the bar code 31 can be read through the transparent window 43. Denoted at 8 is a reticle carrier for storing plural reticles therewithin, along a vertical direction.

In the structure described above, a bar code 31 having information related to a reticle 1 is formed on an end face of the reticle 1. Also, the side face transmission window 43 which is optically transparent is provided on the side face of the storing container. This enables reading of the bar code 31 through the bar code reading device 53 while plural reticles are kept stored and stacked in vertical direction. The bar code reading device 53 may be moved relatively upwardly and downwardly relative to the reticle carrier 8, so that it can read the bar codes of all the reticles stored in the reticle carrier 8.

Figure 8:
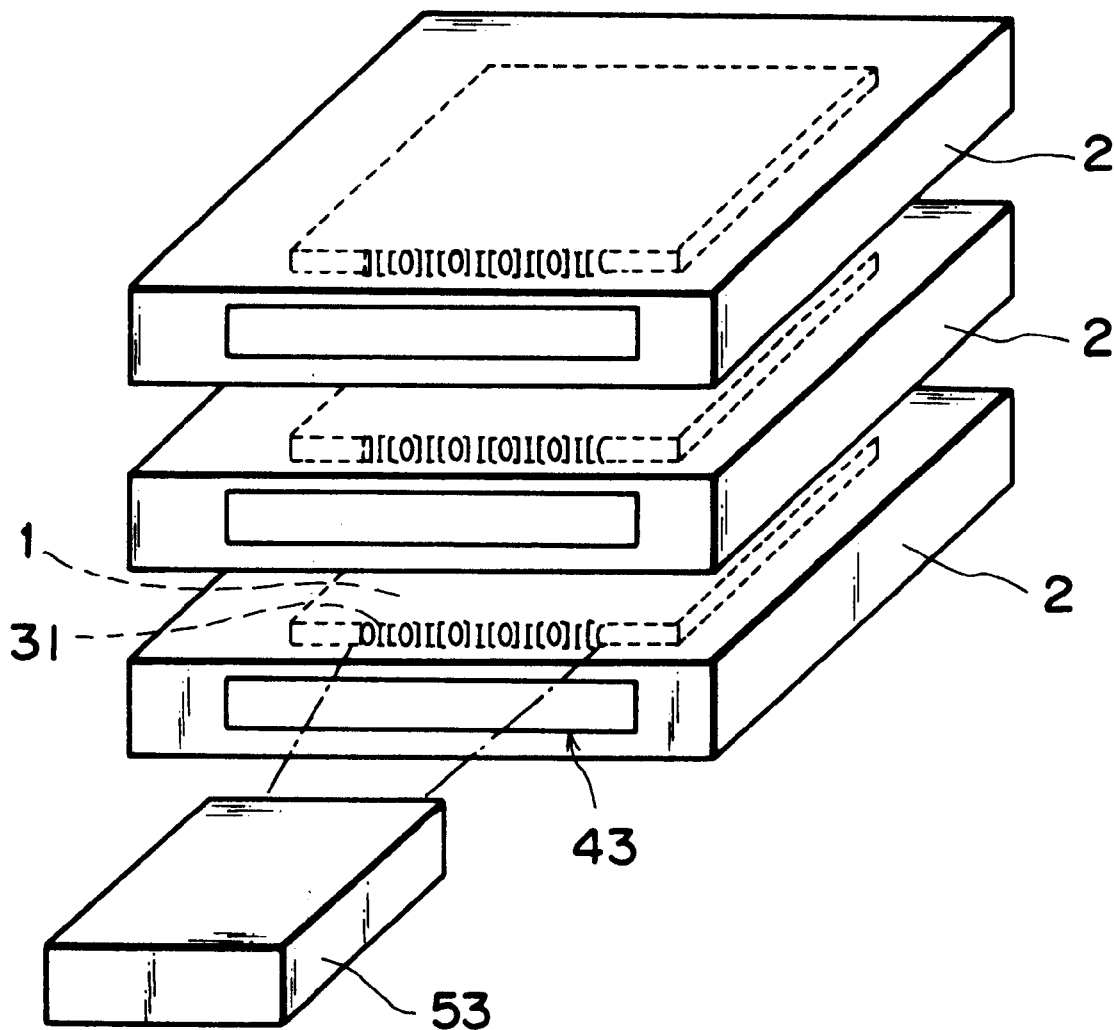
FIG. 8 is a perspective view for explaining reading a bar code on an end face of a reticle stored in a cassette, in another embodiment of the present invention.

In a case where reticles are placed in reticle cassettes, respectively, and where these cassettes are accommodated while being stacked in vertical direction as shown in FIG. 8, the bar code 31 can be read by the bar code reading device 53 through a corresponding side face transmission window 43. Also, like the preceding example, the bar code reading device may be moved relatively upwardly/downwardly relative to the reticle cassettes 2, whereby a bar code of a reticle stored in any desired reticle cassette 2 can be read.

While in the embodiments described above the invention has been described with reference to examples wherein a bar code is used as a code, the code may comprise characters or any other patterns may be used and read if an OCR system or a pattern analyzer is used in the code detecting portion.

Further, the present invention is not limited to use of an optically: recorded code. A magnetically recorded code and a magnetic reading device may be used.

[Embodiment 6]

Next, an embodiment of device manufacture which uses a reticle or a device manufacturing method such as described above, will be explained.

Figure 9:
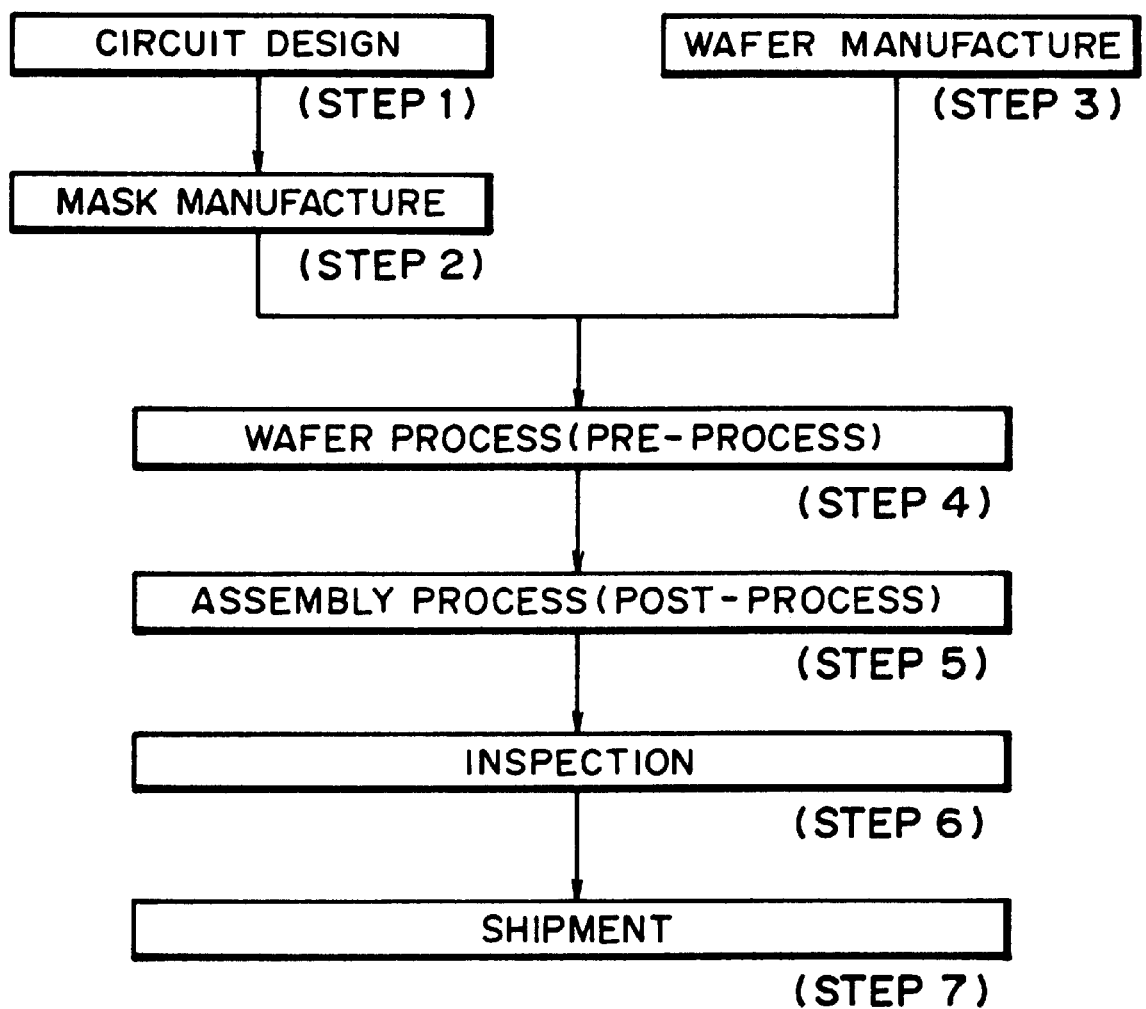
FIG. 9 is a flow chart of microdevice manufacturing processes which use a reticle of FIG. 1 or a device manufacturing method according to the present invention.

FIG. 9 is a flow chart of procedure for manufacture of microdevices such as semiconductor chips (e.g. ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes assembling (dicing and bonding) process and packaging (chip sealing) process. Step 6 is an inspection step wherein operation check, durability check and so on for the semiconductor devices provided by step 5, are carried out. With these processes, semiconductor devices are completed and they are shipped (step 7).

Figure 10:
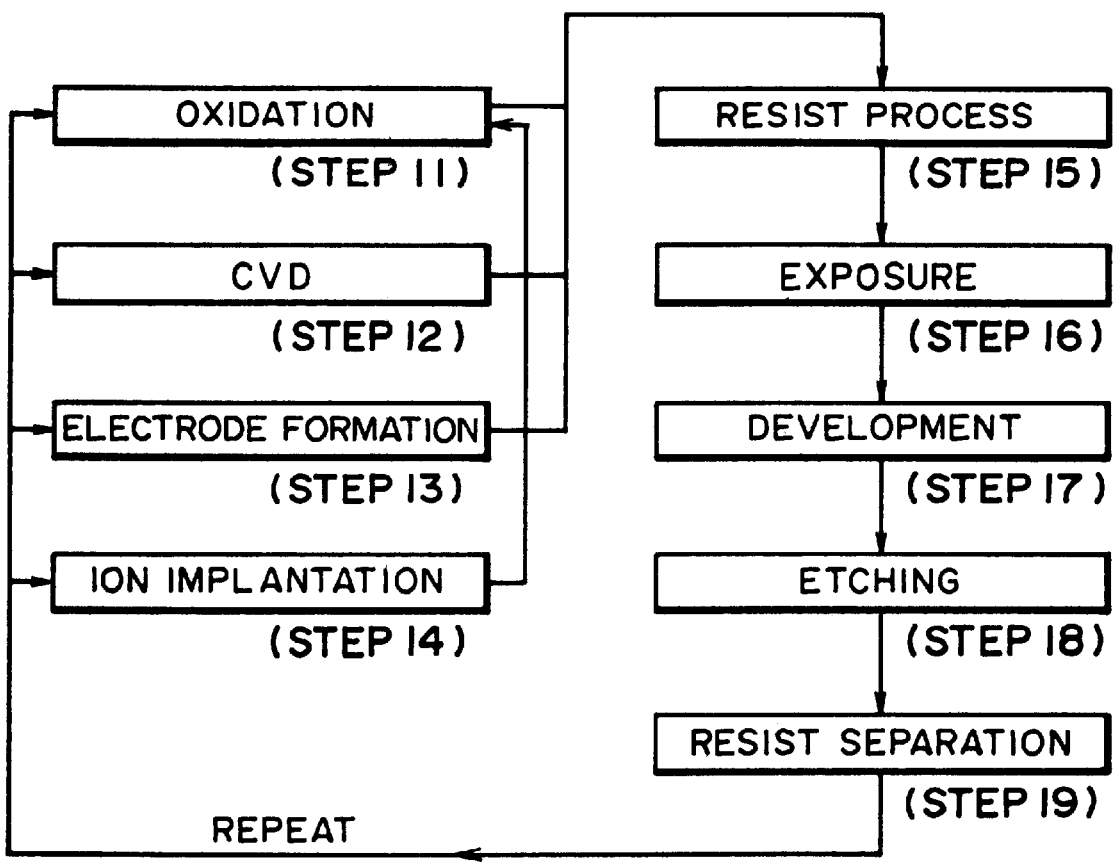
FIG. 10 is a flow chart for explaining details of a wafer process included in the procedure of FIG. 9.

FIG. 10 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In the embodiments of the present invention having been described above, information as recorded on an end face of a substrate is read. This enables easy recording of information within the range of the end face and with a large information capacity. Additionally, even if plural substrates are stored in stack, information reading is easy. Further, at least a portion of a substrate container is made transparent, and the information of a substrate is read directly through the transparent portion. This enables correct, quick and efficient collection of substrate information, substrate registration, substrate identification and/or substrate confirmation.

Thus, in device manufacture, the efficiency and reliability of collection of information related to a substrate such as a reticle or a wafer, as well as the efficiency and reliability of control, conveyance and supply of such substrate or of a cassette or carrier having such substrate stored therein, are improved significantly. This effectively contributes to enhancement of productivity of devices such as semiconductor devices.

While the invention has been described with reference to the structures disclosed herein, it is not confined to the details set forth and this application is intended to cover such modifications or changes as may come within the purposes of the improvements or the scope of the following claims.

What is claimed is:

1. A rectangular-substrate managing system, comprising:
   a reader, arranged to read information recorded on an end face of a substrate having a rectangular shape; and
   a data processor, arranged to perform management of the rectangular substrate on the basis of the recorded information,
   wherein the rectangular substrate has a pattern surface on which a pattern to be transferred is formed, wherein the end face of the rectangular substrate, having the information recorded thereon, is plain and is perpendicular to the pattern surface, and wherein said reader reads the information recorded on the end face of the substrate without moving the substrate in a direction along a plane perpendicular to the end face of the substrate.

2. A rectangular-substrate managing system according to claim 1, wherein said data processor sets parameters, necessary for performing a process related to the substrate, in accordance with the information.

3. A rectangular-substrate managing system according to claim 1, wherein said reader reads the information of the substrate in a portion of a conveyance path including a conveyance start position and a conveyance completion position.

4. A rectangular-substrate managing system according to claim 1, wherein there are plural substrates substrate, and wherein said reader reads the information of a desired substrate as kept stored, during relative movement between a reading position of the reader and the plural substrates stored.

5. A rectangular-substrate managing system according to claim 1, wherein said reader includes a rotator, arranged to rotate the substrate in a horizontal plane, and wherein said reader reads the recorded information as desired end faces of the rotated substrate are positioned at a reading position of the reader, said rotator being arranged to rotate the substrate only for changing the end face to be read, and, during the reading of the recorded information, the information is read without moving the substrate.

6. A semiconductor exposure apparatus including the system of claim 1.

7. A substrate cassette, having a side face, at least a portion of which is made of a transparent material for enabling optical reading of information as recorded on an end face of a rectangular substrate stored in said cassette, without moving the substrate in a direction along a plane perpendicular to the end face of the substrate, wherein the side face of said cassette is made approximately parallel to the end face of the substrate.

8. A rectangular-substrate storing system, comprising:
   a storer, arranged to store therein plural substrates each having a rectangular shape, at storing positions arrayed along a direction perpendicular to the surface of each substrate; and
   a reader, arranged to read information recorded on an end face of a desired substrate as kept stored while relatively moving a reading position and the storing position of that substrate;
   wherein the rectangular substrates are reticles or photomasks each having a pattern surface having a transfer pattern formed thereon, and an end face which is plain and is perpendicular to the pattern surface, and wherein said reader reads the information recorded on the end face of the desired substrate without moving the substrate in a direction along a plane perpendicular to the end face of the substrate.

9. A substrate managing system, comprising:
   a reticle storing container, having a side face, at least a portion of which is made of a transparent material for enabling optical reading of information as recorded on an end face of a rectangular substrate stored in said container; and a reader for reading the information of the reticle, stored in said container, through the transparent material and without moving the reticle in a direction along a plane perpendicular to the end face of the reticle having the information recorded thereon.

10. A substrate managing system according to claim 9, wherein said reader reads the information of the substrate in a portion of a conveyance path including a conveyance start position and a conveyance completion position.

11. A semiconductor exposure apparatus including the system of claim 9.

12. A device manufacturing method, comprising the steps of:

reading information recorded on an original having a pattern; and printing, by exposure, the pattern of the original onto a workpiece to be exposed, on the basis of the information;

wherein in said reading step the information is read through a transparent portion of a cassette in which the original is stored.

13. A device manufacturing method, comprising the steps of:

reading information recorded on an end face of an original having a pattern, without moving the original in a direction along a plane perpendicular to the end face of the original; and transferring, by exposure, the pattern of the original onto a workpiece on the basis of the information;

wherein the original has a rectangular pattern surface on which a pattern to be transferred is formed, and wherein the end face of the original having the information recorded thereon is plain and is perpendicular to the pattern surface.

* * * * *

UNITED STATES PATENT AND TRADEMARK OFFICE
CERTIFICATE OF CORRECTION

PATENT NO. : 6,598,789 B1  Page 1 of 1
DATED : July 29, 2003
INVENTOR(S) : Ken Matsumoto et al.

It is certified that error appears in the above-identified patent and that said Letters Patent is hereby corrected as shown below:

Column 3,
Line 31, "passed" should read -- passed through --; and
Line 36, "as:described" should read -- as described --.

Column 6,
Line 62, "optically:" should read -- optically --.

Column 8,
Line 22, "substrates substrate," should read -- substrates, --; and
Line 54, "substrate;" should read -- substrate, --.

Column 9,
Line 20, "tion;" should read -- tion, --.

Column 10,
Line 1, "wherein" should read -- wherein, --; and "step" should read -- step, --
Line 3, "stored." should read -- stored, the transparent portion of the cassette being provided at a side face of the cassette. --; and
Line 12, "information;" should read -- information, --.

Signed and Sealed this

Thirteenth Day of January, 2004

JON W. DUDAS
*Acting Director of the United States Patent and Trademark Office*